United States Patent
Hwang et al.

(10) Patent No.: US 7,862,855 B2
(45) Date of Patent: Jan. 4, 2011

(54) CONTROLLING EFFUSION CELL OF DEPOSITION SYSTEM

(75) Inventors: Min-Jeong Hwang, Kyunggi-do (KR); Kwan-Seop Song, Kyunggi-do (KR); Do-Geun Kim, Kyunggi-do (KR); Jae-Hong Ahn, Seoul (KR); Sung-Ho Lee, Kyunggi-do (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1175 days.

(21) Appl. No.: 11/325,558

(22) Filed: Jan. 5, 2006

(65) Prior Publication Data

US 2006/0147628 A1 Jul. 6, 2006

(30) Foreign Application Priority Data

Jan. 6, 2005 (KR) ............... 10-2005-0001084
Jan. 6, 2005 (KR) ............... 10-2005-0001085

(51) Int. Cl.
*C23C 16/448* (2006.01)
(52) U.S. Cl. .................................. 427/248.1
(58) Field of Classification Search ............ 427/469, 427/569, 255.23, 248.1
See application file for complete search history.

(56) References Cited

U.S. PATENT DOCUMENTS

| | | | | |
|---|---|---|---|---|
| 3,974,002 A | * | 8/1976 | Casey et al. | 438/22 |
| 4,239,955 A | * | 12/1980 | Cho | 392/388 |
| 4,394,210 A | * | 7/1983 | Morimoto et al. | 117/86 |
| 4,543,467 A | * | 9/1985 | Eisele et al. | 392/388 |
| 4,640,720 A | * | 2/1987 | Foxon | 117/105 |
| 5,041,719 A | * | 8/1991 | Harris et al. | 219/390 |
| 5,321,795 A | | 6/1994 | Alvarez de Toledo | |
| 5,431,735 A | * | 7/1995 | Briones | 118/725 |
| 5,534,314 A | * | 7/1996 | Wadley et al. | 427/585 |
| 5,616,180 A | * | 4/1997 | Lee et al. | 118/715 |
| 5,714,008 A | * | 2/1998 | Lee et al. | 118/715 |

(Continued)

FOREIGN PATENT DOCUMENTS

CN 1519391 8/2004

(Continued)

OTHER PUBLICATIONS

E-Science! brochure on the Titan Effusion Cell. 2005. No page numbers.*

(Continued)

*Primary Examiner*—Bret Chen
(74) *Attorney, Agent, or Firm*—Robert E. Bushnell, Esq.

(57) ABSTRACT

In a method of controlling an effusion cell in a deposition system, including a crucible, a guiding pathway and an injection nozzle, a guiding pathway and an injection nozzle are heated. The crucible is heated after heating the guiding pathway and the injection nozzle. In addition, in cooling the effusion cell including a crucible, a guiding pathway and an injection nozzle, the crucible is cooled. The guiding pathway and the injection nozzle are cooled after cooling the crucible. This method has an advantage of enhancing uniformity of the organic layer formed on the substrate by preventing the clogging of the injection nozzle by deposition material vaporized in the crucible or splashing.

23 Claims, 4 Drawing Sheets

U.S. PATENT DOCUMENTS

| | | | |
|---|---|---|---|
| 5,932,294 A | * | 8/1999 | Colombo et al. ............ 427/469 |
| 6,342,265 B1 | * | 1/2002 | Kelson et al. .................. 427/9 |
| 6,593,580 B2 | * | 7/2003 | Miyabayashi ............... 250/425 |
| 6,695,954 B2 | | 2/2004 | Hong |
| 6,914,016 B2 | | 7/2005 | Tan et al. |
| 6,924,004 B2 | * | 8/2005 | Rao et al. ................ 427/421.1 |

FOREIGN PATENT DOCUMENTS

| | | | |
|---|---|---|---|
| JP | 57-131362 | | 8/1982 |
| JP | 60-124923 | * | 7/1985 |
| JP | 06-172974 | | 6/1994 |
| JP | 2000-012218 | | 1/2000 |
| JP | 2004-327272 | | 11/2004 |
| KR | 10-2004-0093011 | | 11/2004 |
| WO | WO 02/103089 A2 | * | 12/2002 |

OTHER PUBLICATIONS

Panish, Morton B., "Vapor Pressure of Silver". Journal of Chemical and Engineering Data, vol. 6 No. 4, Oct. 1961, pp. 592-594.*

Copland, Evan, "Vapor pressures in the {Al(l)+Al2O3(s)} system: Reconsidering Al2O3(s) condensation". J. Chem. Themodynamics 38 (2006) pp. 443-449.*

Korean Office Action of the Korean Patent Application No. 10-2005-0001084, mailed on Apr. 24, 2006.

*Office Action* from the SIPO issued in Applicant's corresponding Chinese Patent Application No. 2006100003749 dated Jul. 4, 2008.

*Office action* from the Japanese Patent Office issued in Applicant's corresponding Japanese Patent Application 2005-372388 dated Dec. 16, 2008.

Notice of Allowance from TIPO issued in Applicant's corresponding Taiwan Patent Application No. 95100442 dated Feb. 27, 2009.

* cited by examiner

CONTROLLING EFFUSION CELL OF DEPOSITION SYSTEM

CLAIM OF PRIORITY

This application makes reference to, incorporates the same herein, and claims all benefits accruing under 35 U.S.C. §119 from two applications entitled METHOD FOR CONTROLLING EFFUSION CELL OF DEPOSITION SYSTEM, both of which were earlier filed in the Korean Intellectual Property Office on 6 Jan. 2005, and there duly assigned Serial No. 10-2005-0001084 and No. 10-2005-0001085.

BACKGROUND OF THE INVENTION

1. Field of the Invention

The present invention relates to controlling an effusion cell in a deposition system, and more particularly, to a method of controlling an effusion cell in a deposition system that is capable of preventing a change in the characteristics of a material, the clogging of a nozzle and splashing.

2. Description of the Related Art

An Electro Luminescent Display (ELD) is classified into an Inorganic Electro Luminescent Display (IELD) and an Organic Electro Luminescent Display (OELD) in accordance with the material forming the luminescent layer. The OELD can be driven by low voltage, is lightweight and flat and has a wide angular field and also a rapid response speed. Accordingly, those involved in this field are interested in OELDs.

An organic electro luminescent diode of the OELD is composed of an anode, an organic layer and a cathode formed as a lamination on a substrate. The organic electro luminescent diode includes an organic luminescent layer radiating light through the reunion of a hole and an electron. Also, in the organic electro luminescent diode, an organic electron injecting layer and an electron transporting layer are interposed between the cathode and the organic luminescent layer and an organic hole injecting layer and a hole transporting layer are interposed between the anode and the organic luminescent layer in order to enhance the luminescent efficiency by transmitting holes and electrons to the organic luminescent layer.

The organic electro luminescent diode, which has the above-mentioned structure, is fabricated by physical vapor deposition including a vacuum plating method, an ion plating method and a sputtering method or a chemical vapor deposition dependent upon reaction gases. More particularly, in order to form an organic layer of an organic electro luminescent diode, the vacuum plating method is widely used to deposit evaporated organic material in a vacuum. The vacuum plating method uses an effusion cell to inject evaporated organic material on a substrate within a vacuum chamber.

The effusion cell is composed of a crucible having deposition material dissolved in itself and a heater for heating the crucible. In addition, the effusion cell includes an injection nozzle for injecting an evaporated deposition material and a guiding pathway for guiding an evaporated deposition material from the crucible to the injection nozzle. Accordingly, while a substrate is equipped within vacuum chamber, the deposition material, which is heated by the heater and then evaporated, is injected into the substrate by the injection nozzle via the guiding pathway and then deposited.

But the effusion cell entails the problems of the clogging of an injection nozzle and splashing, etc because a deposition material evaporated in a crucible is liquidized and condensed by the condensation of a guiding pathway or an injection nozzle. In conclusion, a non-uniform injection of the evaporated deposition material through the injection nozzle causes the above problems, and thus uniformity of an organic layer formed on a substrate is difficult.

In addition, when the crucible is heated by a deposition rate control method from the beginning, a temperature of the effusion cell is abruptly increased or an overshoot is excessively generated, thereby causing a change in the characteristics of the material or splashing.

SUMMARY OF THE INVENTION

Accordingly, it is an object of the present invention to provide a method of controlling an effusion cell that is able to enhance the uniformity of an organic layer formed on a substrate by preventing the clogging of an injection nozzle or splashing due to the deposition material vaporized in a crucible.

It is another object of the present invention to provide a method of controlling an effusion cell that is able to prevent a change in characteristics of a material and splashing by initially activating the effusion cell using a temperature control method in the heating of the effusion cell and then activating the effusion cell with a deposition rate control method.

The foregoing and/or other aspects of the present invention are achieved by providing a method of controlling an effusion cell including a crucible, a guiding pathway and an injection nozzle, the method including: heating the guiding pathway and the injection nozzle; and heating the crucible after heating the guiding pathway and the injection nozzle.

Heating the crucible preferably includes heating by a first heating structure, and heating the guiding pathway and the injection nozzle includes heating by a second heating structure.

Heating the guiding pathway and the injection nozzle and heating the crucible after heating the guiding pathway and the injection nozzle preferably further includes: heating the crucible using a temperature control method; and heating the crucible using a deposition rate control method.

The method preferably further includes arranging the effusion cell on a buffer area during heating the guiding pathway and the injection nozzle and heating the crucible after heating the guiding pathway and the injection nozzle.

The foregoing and/or other aspects of the present invention are also achieved by providing a method of controlling an effusion cell including a crucible, a guiding pathway and an injection nozzle, the method including: cooling the crucible; and cooling the guiding pathway and the injection nozzle after cooling the crucible.

The deposition rate is preferably monitored after cooling the crucible, and then the guiding pathway and the injection nozzle are cooled after cooling the crucible upon the monitored deposition rate being less than a predetermined value.

The method preferably further includes arranging the effusion cell on a buffer area during cooling the crucible and cooling the guiding pathway and the injection nozzle after cooling the crucible.

The foregoing and/or other aspects of the present invention are further achieved by providing a method of controlling an effusion cell including a crucible, a guiding pathway and an injection nozzle, the method including: heating the guiding pathway and the injection nozzle; heating the crucible; performing a deposition; cooling the crucible; and cooling the guiding pathway and the injection nozzle.

Heating the crucible further preferably includes: heating the crucible using a temperature control method; and heating the crucible using a deposition rate control method.

Performing a deposition preferably includes: determining whether a deposition rate is stable; and performing deposition by shifting the effusion cell to a film forming area upon a determination that the deposition rate is stable.

Determining that a deposition rate is stable preferably includes determining that the deposition rate is within a predetermined range. Determining that a deposition rate is stable preferably includes determining that the deposition rate is within a predetermined range during a predetermined period of time.

The deposition rate is preferably monitored after cooling the crucible, and the guiding pathway and the injection nozzle are cooled upon the monitored deposition rate being less than a predetermined value.

The method preferably further includes arranging the effusion cell on a buffer area during heating the guiding pathway and the injection nozzle, heating the crucible, cooling the crucible, and cooling the guiding pathway and the injection nozzle.

The crucible is preferably heated by a first heating structure, and the guiding pathway and the injection nozzle is heated by a second heating structure.

The foregoing and/or other aspects of the present invention are still further achieved by providing a method of controlling an effusion cell, the method including: heating the effusion cell using a temperature control method; heating the effusion cell using a deposition rate control method after heating the effusion cell using a temperature control method; and performing a deposition.

Heating the effusion cell using a temperature control method preferably includes: setting a first temperature as a target temperature and heating the effusion cell using a temperature control method; and setting a second temperature as a target temperature and heating the effusion cell using a temperature control method.

The first temperature is preferably higher than the second temperature.

The method preferably further includes performing a deposition upon a determination that the deposition rate is stable. The deposition rate is preferably determined to be stable upon the deposition rate being within a predetermined range. The deposition rate is also preferably determined to be stable upon the deposition rate being within a predetermined range during a predetermined period of time.

The method preferably further includes arranging the effusion cell on a buffer area during heating the effusion cell using a temperature control method and heating the effusion cell using a deposition rate control method after heating the effusion cell using a temperature control method, and the effusion cell is shifted to a film forming area during performing a deposition.

The method preferably further includes moving the effusion cell up and down during performing a deposition.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
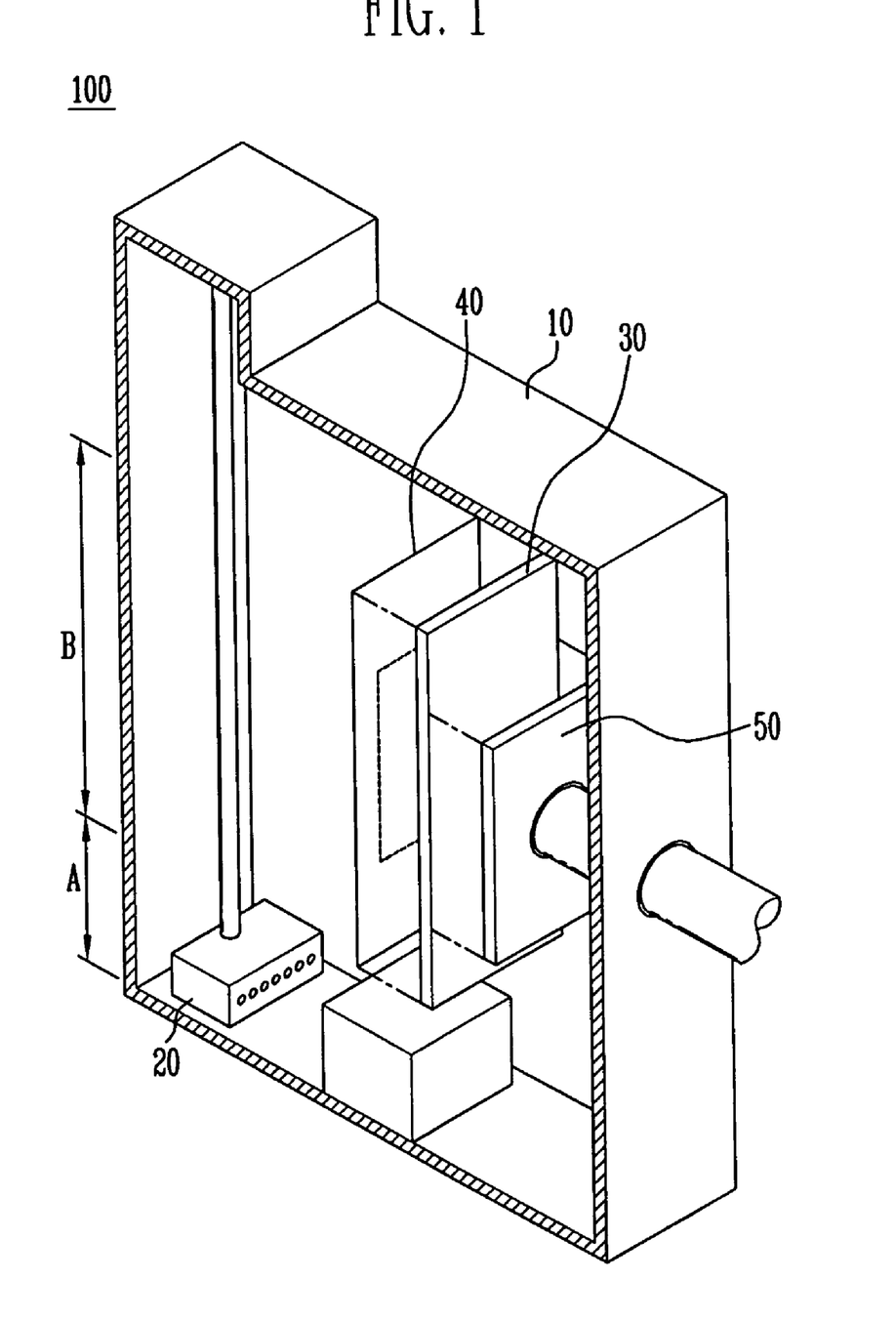
FIG. 1 is a simplified view of a vacuum deposition system employing a control method in accordance with an embodiment of the present invention.
Figure 2:
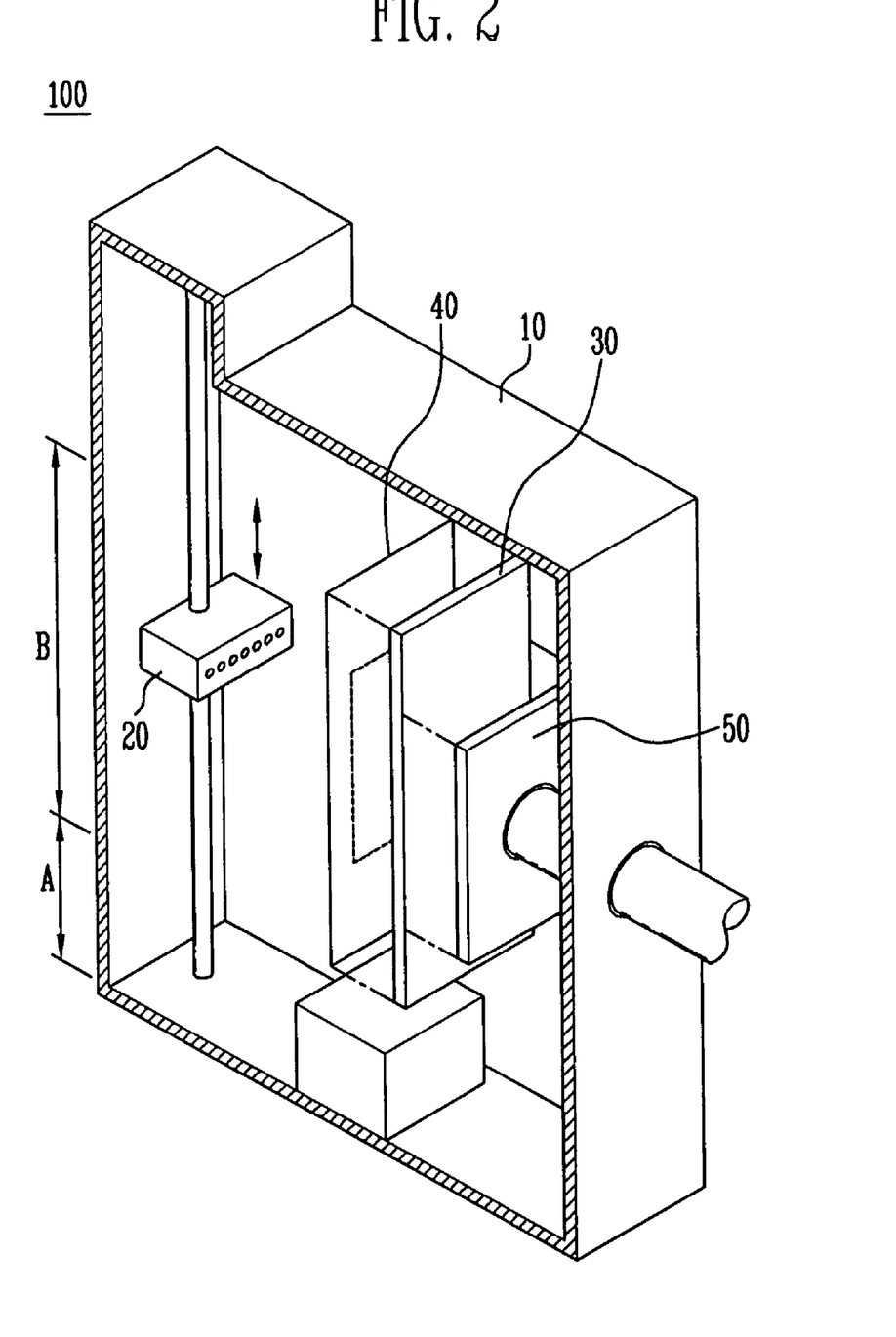
FIG. 2 is a simplified view of a film formation process in a vacuum deposition system employing a control method in accordance with an embodiment of the present invention.

FIG. 1 is a simplified view of a vacuum deposition system employing a control method in accordance with an embodiment of the present invention. FIG. 2 is a simplified view of a film formation process in a vacuum deposition system employing a control method in accordance with an embodiment of the present invention.

Referring to FIGS. 1 and 2, a vertical vacuum deposition system includes a vacuum chamber 10, an effusion cell 20, and a chuck 50. A substrate 30 is loaded in the chuck 50 to face the effusion cell 20 inside of the vacuum chamber 10. A mask 40 has a predetermined pattern corresponding to the pattern to be formed on the substrate 30.

The vacuum chamber 100 includes an arrangement for causing the inside of the vertical vacuum deposition system to be in a vacuum state and to maintain the vacuum state. The vacuum chamber 100 includes a film forming area B corresponding to a setting position of the mask 40 and the substrate 30, and a buffer area A corresponding to a position except for the film forming area B according to the vertical direction that the effusion cell 20 moves.

The effusion cell 20 performs the function of evaporating a deposition material and then providing the evaporated deposition material to the substrate 30. In order to performing a large area deposition, the effusion cell 20 inside of the vacuum chamber 10 is vertically shifted up and down by the activation of a shifter (not shown).

According to an exemplary embodiment of the present invention, in order to prevent a change in characteristics of a material and splashing, the effusion cell 20 is initially controlled by a temperature control method, and then is controlled by a deposition rate control method.

According to another exemplary embodiment of the present invention, in order to prevent the clogging of an injection nozzle 26 (see FIG. 3) and a guiding pathway 24 (see FIG. 3) of the effusion cell 20 and splashing, a crucible 22 (see FIG. 3) is heated after the injection nozzle 26 and the guiding pathway 24 is heated with a heat rise control method of the effusion cell 20, or the injection nozzle 26 and the guiding pathway 24 is cooled after the crucible is cooled with a cool control method.

According to another exemplary embodiment of the present invention, in order to obtain a uniform deposition rate through a stable control of the deposition rate, the effusion cell 20 is initially activated by a temperature control method, then performs a deposition rate control method, and deposition is performed if the deposition rate is within a predetermined value.

The chuck 50 performs the function of loading the substrate 30 and the mask 40. In addition, the chuck 50 performs the function of aligning the mask 40 and the substrate 30.

The substrate 30 and the mask 40 separately are located from the effusion cell 20. The mask 40 is composed of a pattern formation part (displayed as a virtual line in the drawing) formed as a pattern which wishes to be formed on the substrate 30 and a fixed part fixed to a mask frame (not shown) through the weld.

Figure 3:
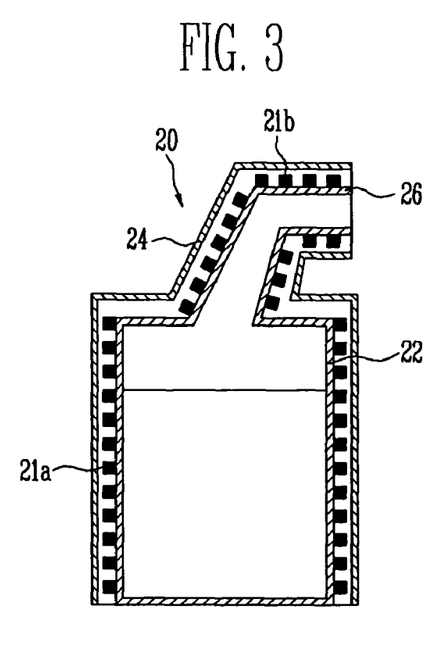
FIG. 3 is a side view of an effusion cell embodying a control method in accordance with an embodiment of the present invention.

FIG. 3 is a side view of an effusion cell embodying a control method in accordance with the present invention.

Referring to FIG. 3, the effusion cell includes a crucible 22, a guiding pathway 24, an injection nozzle 26, a first heating structure 21a and a second heating structure 21b.

A deposition material is located at the crucible 20, and the crucible 20 evaporates the deposition material by the heating of the first heating structure 21a. The guiding pathway 24 is a path for connecting the crucible 20 with the injection nozzle 26 so as to communicate with each other, and a deposition material evaporated in the crucible 20 is injected in the injection nozzle 26. The guiding pathway 24 and the injection nozzle 26 are heated by a second heating structure 21b. The first heating structure 21a and the second heating structure 21b implies a member for emitting heat by conduction. However, the present invention is not limited thereto.

According as the crucible 22 is heated by the first heating structure 21a, a deposition material stored in the crucible 22 is evaporated. As the guiding pathway 24 and the injection nozzle 26 are heated by the second heating structure 21b, an organic vapor material evaporated in the crucible 22 enters the guiding pathway 24 and the injection nozzle 26 in a gaseous state and is then deposited on a substrate without condensation.

Figure 4:
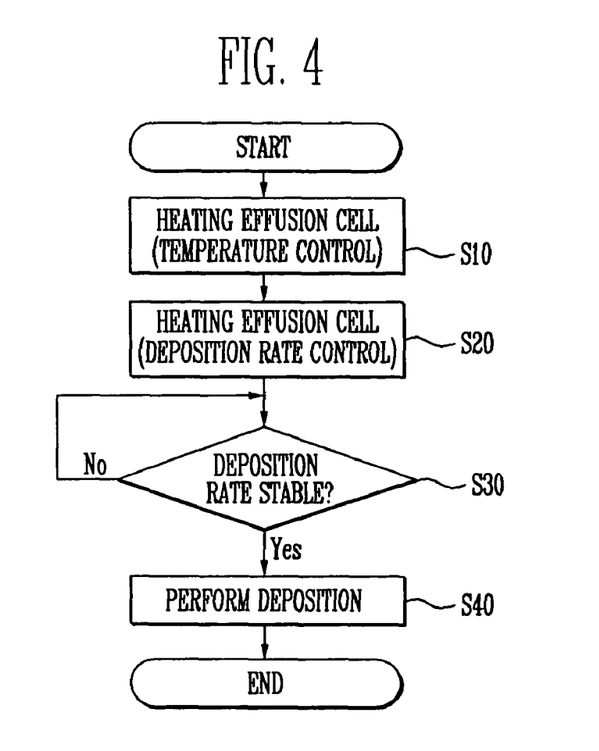
FIG. 4 is a flowchart of a control method of an effusion cell in accordance with one exemplary embodiment of the present invention.

FIG. 4 is a flowchart of a control method of an effusion cell in accordance with one exemplary embodiment of the present invention. Referring to FIGS. 1 through 4, at first, the effusion cell 20 is heated by a temperature control method (S10). In step S10, a temperature of the effusion cell 20 is measured by a temperature sensor (not shown) located in the effusion cell 20, and the control of a deposition rate is performed by changing the amount of electrical power supplied to the effusion cell 20 using the measured temperature. Step S10 can also be divided into a plurality of sub-steps. Adjusting a predetermined target temperature performs a temperature control in the respective sub-steps. Step S10 heating in accordance with the temperature control method includes two sub-steps, a temperature corresponding to about 10% of a target deposition rate is adjusted as target temperature in a first sub-step of the two sub-steps, and the effusion cell 20 is heated by the temperature control method. A temperature corresponding to about 70% of a target deposition rate is adjusted as target temperature in a second sub-step, and the effusion cell 20 is heated by the temperature control method.

Thereafter, the effusion cell 20 is heated by a deposition rate control method (S20). In step S20, a deposition rate of the effusion cell 20 is measured by a deposition rate sensor, and the control of a deposition rate is performed by changing the amount of electrical power supplied to the effusion cell 20 using the measured deposition rate. The deposition rate can be measured by the deposition rate sensor (not shown), and the deposition rate sensor is located in the front of the effusion cell 20. A crystal sensor attached to the effusion cell 20 can be used.

Next, a determination is made as to whether the deposition rate is stable (S30). As one example, the stability of the deposition rate can be determined by determining whether the deposition rate is within a predetermined range, or the stability of the deposition rate can be determined by determining whether the deposition rate is within a predetermined range during a predetermined time period. The predetermined range can be within the range of about ±5% of a target deposition rate. If the deposition rate is not stable, then the deposition rate is monitored by the continuous heating of the effusion cell 20 using the deposition rate control method.

If the deposition rate is stable, the deposition operation is performed (S40). The effusion cell 20 is located in the buffer area A in steps S10 through S30, but the deposition operation is effected after the effusion cell 20 is shifted to the film forming area B in step S40. An evaporated deposition material injected from the injection nozzle 24 of the effusion cell 20 passes through a vacuum space, penetrates the pattern formation part of the mask 40, is adhered to and condensed on the substrate 30 so that a deposition material having a predetermined pattern is formed on the substrate 30. For a uniform thickness of the deposition material deposited on the substrate 30, the effusion cell 20 is shifted up and down while the deposition operation is performed. In this step, the effusion cell 20 is also controlled by the deposition rate control method. The effusion cell 20 is initially shifted back to the buffer area A, and the substrate 30 is exchanged. After that, a determination is made as to whether the deposition rate is stable, the effusion cell 20 is shifted to the film forming area B and then the deposition operation is performed.

According to an exemplary embodiment of the present invention, a control method of the vertical vacuum deposition system can prevent a change in the material characteristics and can prevent splashing by initially activating the effusion cell using a temperature control method in the heating of the effusion cell and then activating the effusion cell using a deposition rate control method.

Figure 5:
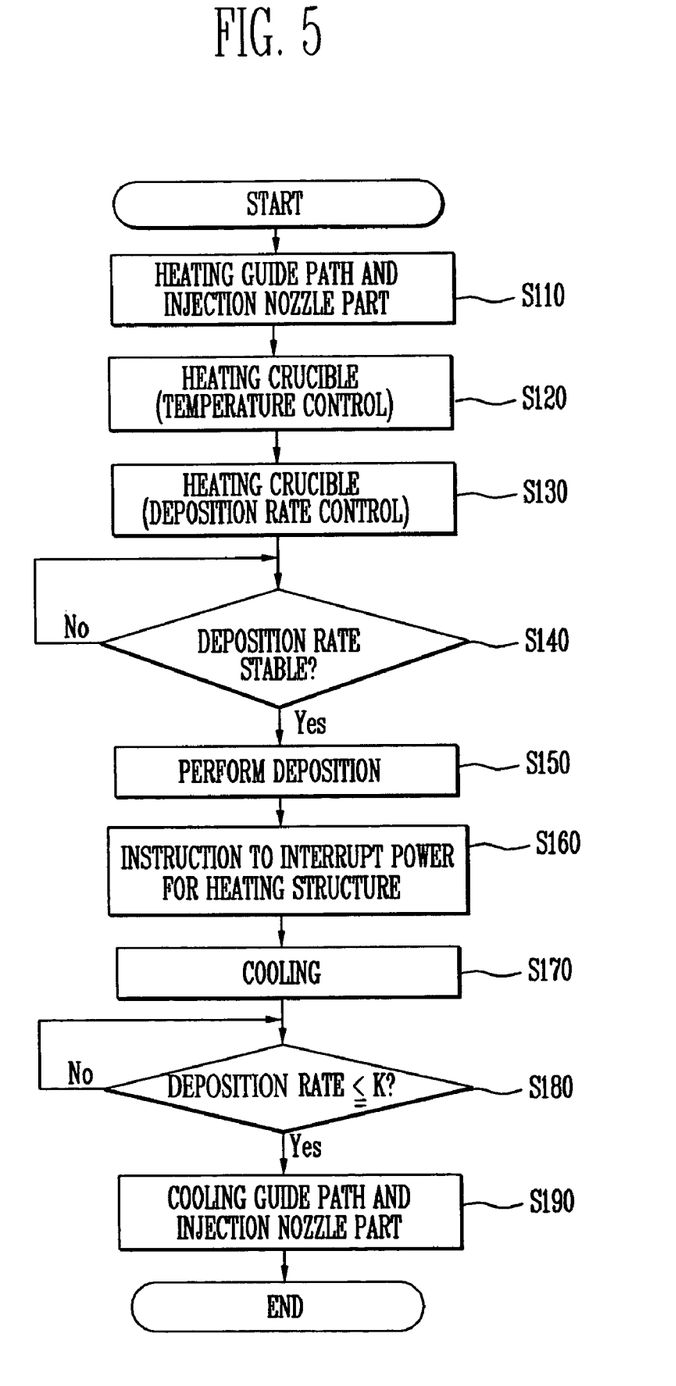
FIG. 5 is a flowchart of a control method of an effusion cell in accordance with another exemplary embodiment of the present invention.

FIG. 5 is a flowchart of a control method of an effusion cell in accordance with another exemplary embodiment of the present invention. Referring to FIGS. 1 through 3, and 5, the guiding pathway 24 and the injection nozzle 26 of the effusion cell 20 is first heated (S110). The guiding pathway 24 and the injection nozzle 26 is heated by the second heating structure 21b. The reason that the guiding pathway 24 and the injection nozzle 26 is heated before the crucible 22 is to prevent clogging of a nozzle or splashing by preventing the liquefaction and the condensation of a deposition material, vaporized in the crucible 22, in the guiding pathway 24 and the injection nozzle 26.

After that, the crucible 22 is heated by a temperature control method S120. In step S120, a temperature of the crucible 22 is measured by a temperature sensor (not shown) located in the crucible 22, and the control of a deposition rate is performed by changing the amount of electrical power supplied to the first heating structure 21a using the measured temperature. The second heating structure 21b can also be heated in accordance with the measured temperature, and a predetermined amount of electrical power can be supplied to the second heating structure 21b regardless of the measured temperature.

After that, the crucible 22 is heated by a deposition rate control method (S130). In step S130, a deposition rate of the effusion cell 20 is measured by a deposition rate sensor, and the control of a deposition rate is performed by changing the electrical power supplied to the first heating structure 21a using the measured deposition rate. The second heating structure 21b can also be heated in accordance with the measured deposition rate, and a predetermined amount of electrical power can be supplied to the second heating structure 21b regardless of the measured deposition rate. The deposition rate sensor can located in the front of the effusion cell 20 and a crystal sensor can be fixed to the effusion cell 20.

After that, a determination is made as to whether the deposition rate is stable (S140). As one example, the stability of the deposition rate can be determined by determining whether the deposition rate is within a predetermined range, or the stability of the deposition rate can be determined by determining whether the deposition rate is within a predetermined range during a predetermined time period. The predetermined range can be within the range of about ±5% of a target deposition rate. If the deposition rate is not stable, the deposition rate is monitored by the continuous heating of the crucible 22 using the deposition rate control method.

If the deposition rate is stable, the deposition operation is performed (S150). The effusion cell 20 is located in the buffer area A in steps S110 through S140, but the deposition operation is effected when the effusion cell 20 is shifted to the film forming area B in step S150. An evaporated deposition material injected from the injection nozzle 24 of the effusion cell 20 passes through a vacuum space, penetrates the pattern formation part of the mask 40, is condensed on the substrate 30 such that a deposition material having a predetermined pattern is formed on the substrate 30. For a uniform thickness of the deposition material deposited on the substrate 30, the effusion cell 20 is shifted up and down while the deposition operation is being performed. In this step, the crucible 22 is also controlled by the deposition rate control method. The effusion cell 20 is initially shifted back to the buffer area A, and the substrate 30 is exchanged. After that, a determination is made as to whether the deposition rate is stable, the effusion cell 20 is shifted to the film forming area B and then the deposition operation is performed.

The power is interrupted to interrupt the deposition operation (S160). For example, if the deposition material stored in the crucible 22 is all exhausted, the deposition operation is interrupted.

If the interruption of the deposition operation is requested, the crucible 22 is initially cooled (S170). The reason that the crucible 24 is cooled before the guiding pathway 24 and the injection nozzle 26 is to prevent the clogging of a nozzle or splashing by preventing the liquefaction and the condensation of a deposition material, vaporized in the crucible 22, in the guiding pathway 24 and the injection nozzle 26.

After that, a determination is made as to whether the deposition rate goes down less than a predetermined value (S180). As one example, the predetermined value is 0.1 Å/s. The step S180 can be omitted, and an operation can performed such that the guiding pathway 24 and the injection nozzle 26 are cooled after a predetermined time has elapsed after the crucible 22 is initially cooled (S170).

After that, the guiding pathway 24 and the injection nozzle 26 are cooled (S190).

Although exemplary embodiments of the present invention have been shown and described, it would be appreciated by those skilled in the art that modifications can be made to these embodiments without departing from the principles and spirit of the present invention, the scope of which is defined by the appended claims.

A method of controlling an effusion cell according to the present invention can enhance uniform degree of an organic layer formed on a substrate by preventing the clogging of an injection nozzle by deposition material vaporized in a crucible and by preventing splashing.

Furthermore, a method of controlling an effusion cell according to the present invention can prevent changes in the material characteristics and splashing by initially activating the effusion cell using a temperature control method in the heating of the effusion cell and then activating the effusion cell using a deposition rate control method.

What is claimed is:

1. A method of controlling an effusion cell including a crucible, a guiding pathway and an injection nozzle, the method comprising:

heating the guiding pathway and the injection nozzle; and
heating the crucible after heating the guiding pathway and the injection nozzle.

2. The method as claimed in claim 1, wherein heating the crucible comprises heating by a first heating structure, and heating the guiding pathway and the injection nozzle comprises heating by a second heating structure.

3. The method as claimed in claim 1, wherein heating the guiding pathway and the injection nozzle and heating the crucible after heating the guiding pathway and the injection nozzle further comprises:

heating the crucible using a temperature control method; and
heating the crucible using a deposition rate control method.

4. The method as claimed in claim 1, further comprising arranging the effusion cell on a buffer area during heating the guiding pathway and the injection nozzle and heating the crucible after heating the guiding pathway and the injection nozzle.

5. A method of controlling an effusion cell including a crucible, a guiding pathway and an injection nozzle, the method comprising:

cooling the crucible; and
cooling the guiding pathway and the injection nozzle after cooling the crucible.

6. The method as claimed in claim 5, wherein the deposition rate is monitored after cooling the crucible, and then the guiding pathway and the injection nozzle are cooled after cooling the crucible upon the monitored deposition rate being less than a predetermined value.

7. The method as claimed in claim 5, further comprising arranging the effusion cell on a buffer area during cooling the crucible and cooling the guiding pathway and the injection nozzle after cooling the crucible.

8. A method of controlling an effusion cell including a crucible, a guiding pathway and an injection nozzle, the method comprising:

heating the guiding pathway and the injection nozzle;
heating the crucible;
performing a deposition;
cooling the crucible; and
cooling the guiding pathway and the injection nozzle.

9. The method as claimed in claim 8, wherein heating the crucible further comprises:

heating the crucible using a temperature control method; and
heating the crucible using a deposition rate control method.

10. The method as claimed in claim 8, wherein performing a deposition comprises:

determining whether a deposition rate is stable; and
performing deposition by shifting the effusion cell to a film forming area upon a determination that the deposition rate is stable.

11. The method as claimed in claim 10, wherein determining that a deposition rate is stable comprises determining that the deposition rate is within a predetermined range.

12. The method as claimed in claim 10, wherein determining that a deposition rate is stable comprises determining that the deposition rate is within a predetermined range during a predetermined period of time.

13. The method as claimed in claim 8, wherein the deposition rate is monitored after cooling the crucible, and the guiding pathway and the injection nozzle are cooled upon the monitored deposition rate being less than a predetermined value.

14. The method as claimed in claim 8, further comprising arranging the effusion cell on a buffer area during heating the guiding pathway and the injection nozzle, heating the crucible, cooling the crucible, and cooling the guiding pathway and the injection nozzle.

15. The method as claimed in claim 8, wherein the crucible is heated by a first heating structure, and the guiding pathway and the injection nozzle is heated by a second heating structure.

16. A method of controlling an effusion cell, the method comprising:
heating the effusion cell using a temperature control method;
heating the effusion cell using a deposition rate control method after heating the effusion cell using a temperature control method; and
performing a deposition.

17. The method as claimed in claim 16, wherein heating the effusion cell using a temperature control method comprises:
setting a first temperature as a target temperature and heating the effusion cell using a temperature control method; and
setting a second temperature as a target temperature and heating the effusion cell using a temperature control method.

18. The method as claimed in claim 17, wherein the second temperature is higher than the first temperature.

19. The method as claimed in claim 16, further comprising performing a deposition upon a determination that the deposition rate is stable.

20. The method as claimed in claim 19, wherein the deposition rate is determined to be stable upon the deposition rate being within a predetermined range.

21. The method as claimed in claim 19, wherein the deposition rate is determined to be stable upon the deposition rate being within a predetermined range during a predetermined period of time.

22. The method as claimed in claim 16, further comprising arranging the effusion cell on a buffer area during heating the effusion cell using a temperature control method and heating the effusion cell using a deposition rate control method after heating the effusion cell using a temperature control method, and the effusion cell is shifted to a film forming area during performing a deposition.

23. The method as claimed in claim 16, further comprising moving the effusion cell up and down during performing a deposition.

* * * * *